(12) United States Patent
Mandica et al.

(10) Patent No.: US 8,427,033 B2
(45) Date of Patent: Apr. 23, 2013

(54) DOMESTIC APPLIANCE COMPRISING A PIEZOELECTRIC PUMP PROVIDED WITH A SIMPLIFIED POWER SUPPLY CIRCUIT

(75) Inventors: Franck Mandica, Francheville (FR); Serge Cubizolles, Oytier Saint Oblas (FR); Olivier Lavillat, Quintal (FR); Bertrand Couet, Loire sur Rhone (FR)

(73) Assignee: Seb S.A., Ecully (FR)

( * ) Notice: Subject to any disclaimer, the term of this patent is extended or adjusted under 35 U.S.C. 154(b) by 323 days.

(21) Appl. No.: 12/935,137

(22) PCT Filed: Mar. 27, 2009

(86) PCT No.: PCT/FR2009/000343
§ 371 (c)(1),
(2), (4) Date: Sep. 28, 2010

(87) PCT Pub. No.: WO2009/130407
PCT Pub. Date: Oct. 29, 2009

(65) Prior Publication Data
US 2011/0018391 A1     Jan. 27, 2011

(30) Foreign Application Priority Data
Mar. 28, 2008 (FR) .................. 08 01706

(51) Int. Cl.
    *H01L 41/09* (2006.01)
(52) U.S. Cl.
    USPC ........................................ 310/317
(58) Field of Classification Search .......... 310/317
    See application file for complete search history.

(56) References Cited

U.S. PATENT DOCUMENTS

| | | | |
|---|---|---|---|
| 3,447,151 A * | 5/1969 | Potter | 379/373.01 |
| 4,126,867 A * | 11/1978 | Stevenson, Jr. | 347/10 |
| 4,237,399 A * | 12/1980 | Sakamoto | 310/317 |
| 4,493,062 A * | 1/1985 | Mallett | 367/32 |
| 4,708,600 A | 11/1987 | AbuJudom, II et al. | |
| 4,939,405 A | 7/1990 | Okuyama et al. | |
| 5,324,314 A * | 6/1994 | Boetzkes | 607/51 |
| 6,204,591 B1 * | 3/2001 | Nariai | 310/316.03 |
| 7,154,210 B2 * | 12/2006 | Hoshino | 310/317 |
| 2004/0189412 A1* | 9/2004 | Kato | 331/158 |
| 2007/0216256 A1* | 9/2007 | Vogeley | 310/317 |

FOREIGN PATENT DOCUMENTS

| | | |
|---|---|---|
| EP | 0 322 899 A2 | 7/1989 |
| EP | 0 459 559 A1 | 12/1991 |
| JP | 6158286 A | 3/1986 |
| WO | WO 00/36302 A1 | 6/2000 |

* cited by examiner

*Primary Examiner* — Thomas Dougherty
(74) *Attorney, Agent, or Firm* — Browdy and Neimark, PLLC

(57) ABSTRACT

The invention relates to a circuit (20) for supplying power to a piezoelectric pump (10) from the electric network (25). According to the invention, the circuit (20) supplies power to the pump (10) directly at the frequency of the electric network (25), and said circuit (20) comprises at least means for limiting the current absorbed by the pump (10) arranged in series with said pump (10).

10 Claims, 2 Drawing Sheets

DOMESTIC APPLIANCE COMPRISING A PIEZOELECTRIC PUMP PROVIDED WITH A SIMPLIFIED POWER SUPPLY CIRCUIT

The present invention relates to an electrical household appliance equipped with a piezoelectric pump provided with a power supply circuit.

In the field of the appliances of the above type, the piezoelectric pump generally has a chamber presenting a flexible membrane on which a piezoelectric element is attached. The chamber has an inlet conduit and an outlet conduit both comprising a one-way valve.

In operation, the piezoelectric element will vibrate at the frequency of an alternating voltage provided by a supply circuit and with an amplitude controlled by this voltage, thus generating a succession of cycles of aspiration and delivery.

Known supply circuits for such a piezoelectric pump have complex electronics that, starting from the voltage available from the electrical network or a battery, recreates a signal having a frequency and form adapted to the piezoelectric element of the pump to oscillate.

This type of supply circuits presents the disadvantage of requiring expensive and numerous electronic components, source of potential breakdowns.

The object of the present invention is to remedy the aforesaid disadvantages and to propose an electrical household appliance equipped with a piezoelectric pump whose circuit for supply, coming from the supply circuit, is simple and economical to implement.

Another object of the invention is to propose an electrical household appliance equipped with a piezoelectric pump the supply circuit of which has great reliability and reliable operation.

Another object of the invention is to propose an electrical household appliance equipped with a piezoelectric pump whose supply circuit guarantees a regularity of the flow supplied by the pump.

These objects are achieved with a circuit for supplying power to a piezoelectric pump from an electric network, wherein said circuit supplies the pump directly at the frequency of the electric network and said circuit comprises at least means to limit the current absorbed by the pump, arranged in series with said pump.

By electric network, one understands the domestic electrical network delivering a current of the alternating voltage type comprised, depending on the country, between 100 volts and 240 volts and at a frequency comprised between 50 hertz and 60 hertz.

In accordance with the invention, the supply circuit applies a voltage the frequency of which results directly from the electric network, without change or transformation, which makes it possible to obtain a very simple circuit.

Moreover, the circuit has means to limit the current absorbed by the pump arranged in series. This provision makes it possible to protect the pump and to ensure a reliable operation under the particular conditions of the type of connection on the network, operation while empty or with interference on the network.

Preferably, the means to limit the current absorbed by the pump comprise a resistance.

This provision makes it possible to obtain a very simple and very economic supply circuit.

Preferably, the circuit comprises at least a resistance in parallel with the pump.

This provision makes it possible to protect the pump and to ensure a reliable operation when the supply for the pump is shut off.

Preferably, the circuit comprises means to limit the voltage at the terminals of the pump, arranged in parallel with said pump.

This provision makes it possible to be freed from the fluctuations of the network and the variations of the physical characteristics of the piezoelectric element (such as for example the capacitance) and thus to obtain a regular flow of the pump.

Preferably, the means to limit the voltage at the terminals of the pump arranged into parallel with said pump comprise at least two Zener diodes.

This provision makes it possible to fulfill this function with economical commercially available components.

The invention also relates to an electrical household appliance comprising a piezoelectric pump and a supply circuit for said pump, wherein said supply circuit is in conformity with the invention.

This provision makes it possible to optimize the cost of such an appliance using a very economical supply circuit.

The invention will be better understood from a study of the embodiment given by way of non-limiting example and illustrated in the annexed figures in which.

Figure 1:
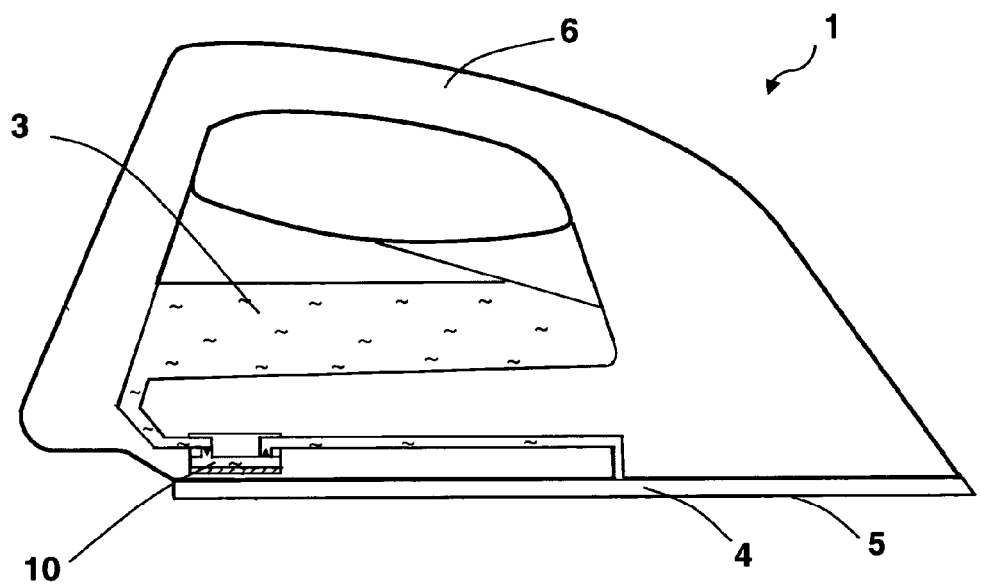
FIG. 1 illustrates a schematic sectional view of the appliance according to a particular embodiment of the invention.

As is visible in FIG. 1, the appliance in accordance with the invention is a pressing iron 1 comprising a piezoelectric pump 10 that permits transfer of water from a reservoir 3 towards a steam chamber 4 comprised in a heating soleplate 5, provided with steam diffusion openings.

Figure 2:
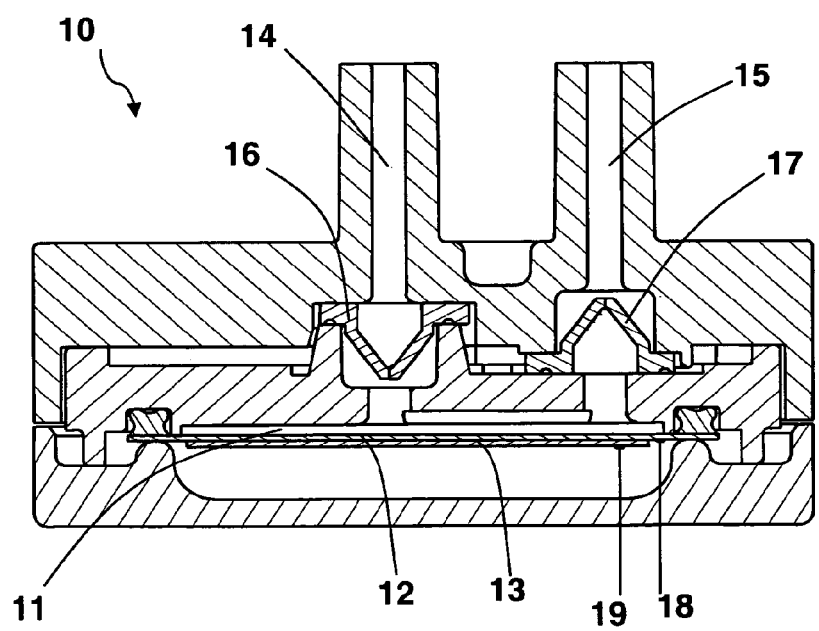
FIG. 2 illustrates a cross-sectional view of the piezoelectric pump of the appliance of FIG. 1.

As is visible in FIG. 2, piezoelectric pump 10 comprises a circular chamber 11 comprising a lower wall formed by a flexible membrane 12 made of brass. A ceramic piezoelectric element 13 is fixed on membrane 12, outside circular chamber 11. Circular chamber 11 comprises an upper wall provided with an inlet conduit 14 coupled to reservoir 3 and with an outlet conduit 15 coupled to steam chamber 4.

Piezoelectric pump 10 has a power supply terminal 18 fixed on membrane 12 and a power supply terminal 19 fixed on piezoelectric element 13. Pump 10 is supplied via its terminals 18, 19 by an alternating electric voltage.

At the time of the positive portion of the signal, piezoelectric element 13 becomes deformed, actuating membrane 12, in a manner to increase the volume of circular chamber 11.

Outlet conduit 15 has a one-way valve 17 that closes and prevents aspiration of water present downstream of valve 17. Inlet conduit 14 also has a one-way valve 16 that opens and allows water present in inlet conduit 14, coming from reservoir 3 (FIG. 1), to be aspirated into circular chamber 11.

At the time of the negative portion of the signal, piezoelectric element 13 becomes deformed, actuating membrane 12, in a manner to decrease the volume of circular chamber 11. Valve 16 of inlet conduit 14 is closed and at the same time valve 17 of outlet conduit 15 opens. Thus, water will pass from circular chamber 11 towards steam chamber 4 (FIG. 1).

Piezoelectric element 13 and membrane 12 form a piezoelectric actuator chosen among models commercial, manufactured in large series.

Figure 3:
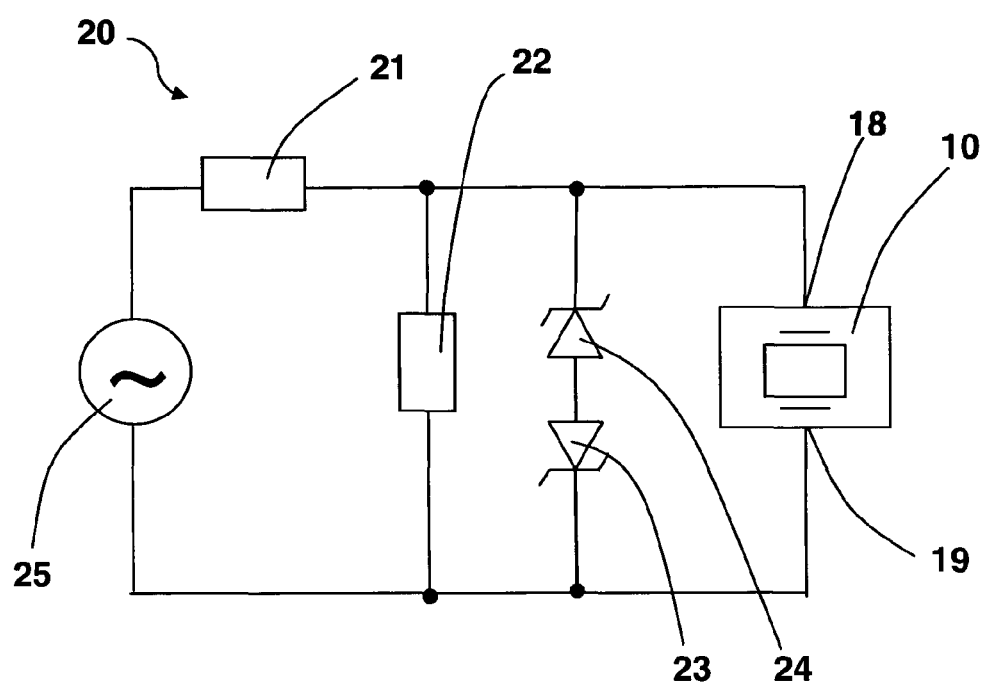
FIG. 3 illustrates a schematic view of the supply circuit of the piezoelectric pump of FIG. 2.

As is visible in FIG. 3, piezoelectric pump 10 is supplied by a supply circuit 20 from an electrical network 25 delivering an alternating voltage, for example 230 volts, at a frequency, for example 50 hertz, this frequency being applied without change to terminals 18, 19 of pump 10.

Supply circuit 20 comprises a resistance 21, arranged in series with pump 10, which makes it possible to limit the current absorbed by pump 10 in the different critical phases of operation that can occur during the use of appliance 1 and that contributes to protecting piezoelectric element 13.

In a critical first phase, when one connects pump 10 directly to electrical network 25, the piezoelectric actuator, which is comparable to a capacitance, is first of all equivalent to a short circuit draws a peak of current. The peak of current is all the higher as the connection to the voltage is made at a voltage near the top of the alternation. For an electrical network delivering a voltage of 230 volts, the piezoelectric actuator can be subjected to a maximum voltage of 230× $\sqrt{2}$=325 volts.

A second critical phase appears also when pump 10 is supplied when its circular chamber 11 is empty (one calls this type of operation "operation when empty or dry"), the piezoelectric actuator heats up. This results in modifying its capacitance and causing the current which it consumes to increase. The increase of the consumed current accelerates the heating and the phenomenon grows until the destruction of piezoelectric element 13.

In a critical third phase, the peaks of current are interference provided by the electrical network.

In a preferential manner, supply circuit 20 also comprises a resistance 22 connected in parallel with pump 10. This resistance 22 makes it possible to discharge the piezoelectric actuator, equivalent electrically to a capacitance, after the supply of power has been halted, and also makes it possible to protect the piezoelectric actuator against an overcurrent during reconnection on electrical network 25.

Thus, as an example, the piezoelectric actuator comprises a piezoelectric element 13 of ceramic and a flexible membrane 12, both of a thickness ranging between 0.005 and 1 millimeter, preferably 0.3 millimeter.

Resistance 21 has a value ranging between 1 and 100 kilohms, preferably 15 kilohms, and resistance 22 has a value ranging between 100 and 2000 kilohms, preferably 1000 kilohms.

In an advantageous manner, supply circuit 20 comprises also two Zener diodes 23, 24 connected in polarity opposition to one another in parallel with pump 10. These Zener diodes 23, 24 make it possible to limit the voltage between terminals 18, 19 of the pump, one diode for the positive alternations and the other diode for the negative alternations. Thus, one is free from the fluctuations of the voltage delivered by the electrical network to guarantee a regularity of the flow supplied by pump 10. Thus, as an example, for an electrical network delivering a voltage of 230 volts, diodes 23, 24 limit the voltage to a value ranging between 80 and 200 volts, preferably 180 volts.

Such a characteristic especially makes it possible to be in conformity with future CECED agreements between the pressing iron manufacturers, applicable in July 2008, on the precision of the announced flow of steam compared to the actual flow in an iron.

Resistances 21, 22 cause a drop in the maximum value of the signal at the terminals of pump 10 and Zener diodes 23, 24 will limit this same signal but the frequency is identical with the frequency of the electrical network.

Pressing iron 1 (FIG. 1) has a handle 6. In an advantageous manner, the supply circuit (not represented in FIG. 1) is arranged in handle 6 to avoid thermal stresses on this supply circuit.

Of course, the invention is by no means limited to the embodiment described and illustrated which was given only as example. Changes remain possible, especially from there viewpoint of the constitution of the various elements or by substitution of technical equivalents, without leaving for all that the field of protection invention.

Thus, an impedance of the capacitance type can be added to the resistance arranged in series with the pump to limit the absorbed current.

The invention claimed is:

1. A power supply circuit for supplying power to a piezoelectric pump, from a domestic AC power network, directly at the frequency of the network, said circuit comprising:
   means connected in series with the pump for limiting the current absorbed by the pump;
   means to limit the voltage at the terminals of the pump, arranged in parallel with the pump; and
   at least one first resistance connected in parallel with the pump, wherein said means for limiting the current absorbed by the pump are separate from said first resistance.

2. The circuit of claim 1, wherein the means to limit the current absorbed by the pump and the first resistance have fixed values.

3. The circuit of claim 2, wherein the means to limit the current absorbed by the pump comprise a second resistance.

4. The circuit of claim 1, wherein the means to limit the current absorbed by the pump comprise a second resistance.

5. The circuit of claim 1, wherein the means to limit the voltage at the terminals of the pump, arranged in parallel with the pump, comprise at least two Zener diodes.

6. Household electrical appliance comprising: a piezoelectric pump; and the power supply circuit of claim 1 connected to said pump for supplying electrical power for operating said pump.

7. Household electrical appliance comprising: a piezoelectric pump; and the power supply circuit of claim 2 connected to said pump for supplying electrical power for operating said pump.

8. Household electrical appliance comprising: a piezoelectric pump; and the power supply circuit of claim 3 connected to said pump for supplying electrical power for operating said pump.

9. Household electrical appliance comprising: a piezoelectric pump; and the power supply circuit of claim 4 connected to said pump for supplying electrical power for operating said pump.

10. Household electrical appliance comprising: a piezoelectric pump; and the power supply circuit of claim 5 connected to said pump for supplying electrical power for operating said pump.

* * * * *